United States Patent [19]

Gilly et al.

[11] 4,360,964
[45] Nov. 30, 1982

[54] NONDESTRUCTIVE TESTING OF SEMICONDUCTOR MATERIALS

[75] Inventors: Randall K. Gilly, Northampton; David L. Rehrig, Bethlehem, both of Pa.

[73] Assignee: Western Electric Co., Inc., New York, N.Y.

[21] Appl. No.: 240,444

[22] Filed: Mar. 4, 1981

[51] Int. Cl.³ .............................................. G01R 27/02
[52] U.S. Cl. ......................................... 29/574; 324/62; 357/65
[58] Field of Search ............... 29/574; 324/62; 357/65

[56] References Cited

U.S. PATENT DOCUMENTS 3,339,272  9/1967  MacIver et al. ..................... 29/574
3,518,545  6/1970  Copeland et al. .................... 29/574
3,794,912  2/1974  Severin et al. ....................... 324/62

OTHER PUBLICATIONS

Turner et al. Solid St. Electronics, vol. 11 (1968) 291.
Crowell et al. Jour. Appl. Phys. 36 (1965) 3848–3849.
Severin et al. Jour. Electrochem. Soc. 119 (Oct. 1972) 1384.
ASTM Designation F-419-79 pp. 840–851, 1980 Ann. Book of ASTM Standards Pt. 43, Electronics.
Irene et al. Jour. Electrochem Soc. 124 (1977) 1757.
Kaus et al. IBM-TDB, 21 (1978) 654.
Rehrig et al. in Semiconductor International, vol. 43, May 1980, pp. 151–162.

*Primary Examiner*—Upendra Roy
*Attorney, Agent, or Firm*—W. O. Schellin

[57] ABSTRACT

An n-type region of a semiconductor body, such as a surface region of a bulk wafer or an epitaxial layer region grown on a wafer (12), is successfully submitted to a capacitance-voltage test using a mercury probe (11) after being subjected to a pretreatment. The pretreatment includes forming a thin oxide layer, preferably in the order of 10 to 20 Angstrom units thick, on the surface of the wafer (12), and pulsing the mercury into contact with the pretreated surface while a reverse bias voltage is applied between the mercury and the region. If a resulting reverse leakage current exceeds a desired current threshold value, the pulsing of the mercury into contact with the surface of the water (12) is repeated until a rectifying contact having a sufficiently low reverse leakage current through the mercury-to-semiconductor interface has been established.

12 Claims, 3 Drawing Figures

NONDESTRUCTIVE TESTING OF SEMICONDUCTOR MATERIALS

TECHNICAL FIELD

This invention relates generally to processing semiconductor materials and particularly to forming a rectifying contact at the surface of a semiconductor body. The invention is described with respect to nondestructively testing semiconductor wafers. While the invention is particularly useful in testing doping concentrations and doping profiles of n-type epitaxial layers, the methods described herein also apply to testing the doping concentrations of doped bulk wafers.

BACKGROUND OF THE INVENTION

Successfully processing semiconductor materials into often highly sophisticated integrated circuits depends on tight process controls. Fast turnaround testing of processed materials such as wafers becomes imperative for maintaining tight controls over successively processed wafer lots. After initial wafer preparation processes, such as polishing or epitaxial layer deposition, it becomes desirable to determine dopant concentrations at or near the intended device surfaces of the wafers. Such determinations can be made by known capacitance-voltage measurements. Such capacitance-voltage measurements require, however, a p-n junction or Schottky diode to be formed on the surface of the wafer to be tested. Frequently, the preparation of the wafer for the test, or the test itself, is destructive to the wafer, in that the preparation for the test or the test procedure damages the wafer to the extent that the tested wafer cannot be processed further to form the desired devices.

Consequently, in forming, for example, n-type epitaxial layers on bulk wafers, it has been a practice, in the past, to include special test wafers with every process lot of wafers placed into an epitaxial reactor. A typical radiantly heated barrel reactor, referred to herein as epi reactor, holds, on a susceptor, 14 wafers of a typical 100 mm diameter size.

According to the practice of processing the dedicated test wafers with each lot of process wafers, two of the 14 wafers are typically used for determining the acceptability of the grown epi layers on the other 12 wafers in each lot. These test wafers are strategically placed on the susceptor such that all other process wafers become positioned in the proximity of the test wafers. The assumption is that the process wafers grow epi layers of substantially the same thickness and with the same doping concentrations as the test wafers.

Using the test wafers has, of course, the disadvantage that the throughput of each epi reactor is reduced by approximately 14 percent. A further disadvantage is that the process wafers are accepted or rejected by deductive reasoning based on the assumption that the epi layer characteristics on the process wafers are substantially the same as those on the test wafers. A decision of such assumption may be wrong, however, when the characteristics measured on the test wafers are only marginally acceptable.

A nondestructive method for making capacitance-voltage measurements on p-type doped silicon material is known. Such a method, of course, has the advantage of eliminating the need for the dedicated test wafers, thereby raising the throughput of the referred to epi reactor by 17 percent, and further of permitting each process wafer to be tested separately in case a marginally acceptable lot of wafers has been processed.

According to the method, the p-type surface of the deposited epi layer is brought into contact with a column of mercury. The mercury is known to form a rectifying junction with a p-type doped silicon surface. The method requires stringent cleaning steps and preferably a nitric acid treatment of the silicon surface to be tested. However, once the rectifying junction has been formed at the interface between the mercury and the silicon material, well known test procedures are used to determine the doping concentration in the epi layer or in any p-type doped wafer to a depth which is equal to the depth of the depletion layer before the junction breaks down under the increasing reverse bias voltages. The voltage at which breakdown of the rectifying junction occurs limits the depth to which the doping profile can be determined. Until such breakdown occurs, the reverse bias voltage of the diode is stepped through a range of gradually increasing voltages. At each voltage level a capacitance measurement is made, the result of which yields, through calculations with equations well known in the art, the effective doping concentration down to the depth of the depletion layer at that particular reverse bias voltage.

An n-type silicon-to-mercury interface is known, however, to form an ohmic or non-rectifying contact. Thus, when the mercury column is brought into contact with the surface of a cleaned n-type wafer region, an ohmic contact is formed. The physical phenomenon which is advantageously available to nondestructively test p-type wafers, does not avail itself for testing n-type wafers.

However, it has been suggested to oxidize n-type wafers by boiling them for about one minute in a solution of nitric acid or hydrogen peroxide and sulfuric acid. It further has been suggested that such a preparation process produces an oxide layer between 20 and 50 Angstrom units thick. The presence of a layer of oxide between 10 and 100 Angstrom units has been looked upon as a physical requirement to form, by a little understood process referred to as quantum-mechanical tunneling, a rectifying junction at the interface layer between the mercury and the n-type silicon.

Unfortunately, attempts have failed to rapidly form low leakage current diodes at the mercury-to-silicon interface layer using the reported oxidizing agents to form a thin oxide layer on the surfaces on n-type wafers. At most, even with good process controls, high leakage current diodes have formed, but in most cases, substantially ohmic contacts have resulted. Thus, even with the suggested mechanism for forming rectifying junctions between mercury and n-type doped silicon surfaces, n-type wafers have continued to be processed with the prior art destructive testing techniques, simply because rectifying junctions could not be formed to test manufactured wafers with a mercury probe.

SUMMARY OF THE INVENTION

We have now found methods of forming a rectifying contact. In accordance with our invention, a surface of a semiconductor body which has as n-type region adjacent to such surface is treated with water at an elevated temperature. Mercury is thereafter placed into contact with the treated surface.

According to another embodiment of our invention, a surface of a semiconductor body having an n-type region adjacent to such surface is treated with an oxidizing agent. Thereafter, the treated surface is contacted repeatedly with mercury while the mercury is under a negative electrical bias with respect to the semiconductor region.

A described technique whereby silicon wafers having n-type regions adjacent to surfaces thereof are first treated in boiling water and then contacted by a column of mercury in a predetermined area has been found advantageous for nondestructively testing such regions to determine, among other characteristics, their dopant concentration profiles.

BRIEF DESCRIPTION OF THE DRAWING

The following detailed description of this invention and of its various features and advantages may be best understood when it is read in reference to the accompanying drawing, wherein.

DETAILED DESCRIPTION

1. A Mercury Probe Apparatus

Figure 1:
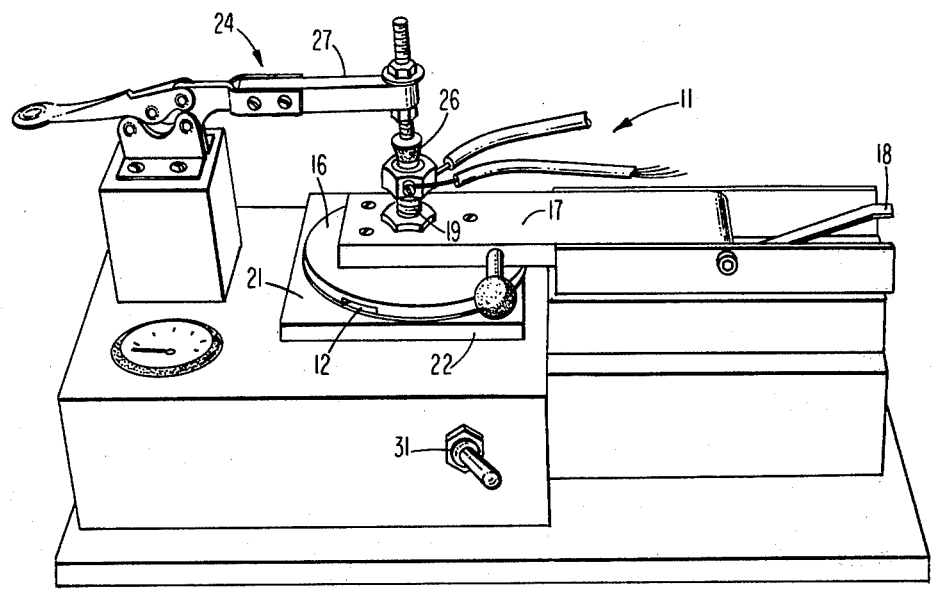
FIG. 1 is a pictorial view of a prior art test apparatus, which, when coupled to an appropriately chosen electrical circuit, becomes an efficient apparatus for forming diode interfaces with n-type wafers in accordance with the features of this invention.

Referring now to FIG. 1, there is shown a prior art mercury probe apparatus, which is designated generally by the numeral 11. The function of the apparatus 11 is, as its name implies, to contact a semiconductor body, such as a silicon wafer 12 with a mercury column 13 (as is best shown in the sectional view of FIG. 2). To perform an electrical test, the mercury column 13 and the wafer 12 are coupled to a test set module 14. The module 14 may be any of a number of commercial test sets with a capability of performing capacitance-voltage tests, and which typically include, for example, circuits for applying a voltage of a controlled magnitude and reading resulting voltages.

Figure 2:
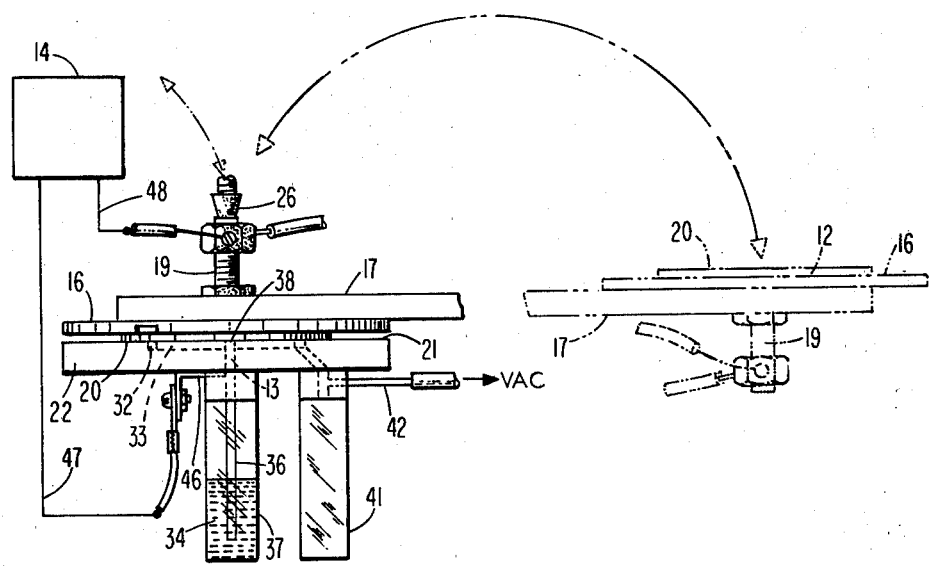
FIG. 2 is a simplified sectional view of portions of the apparatus shown in FIG. 1.
Figure 3:
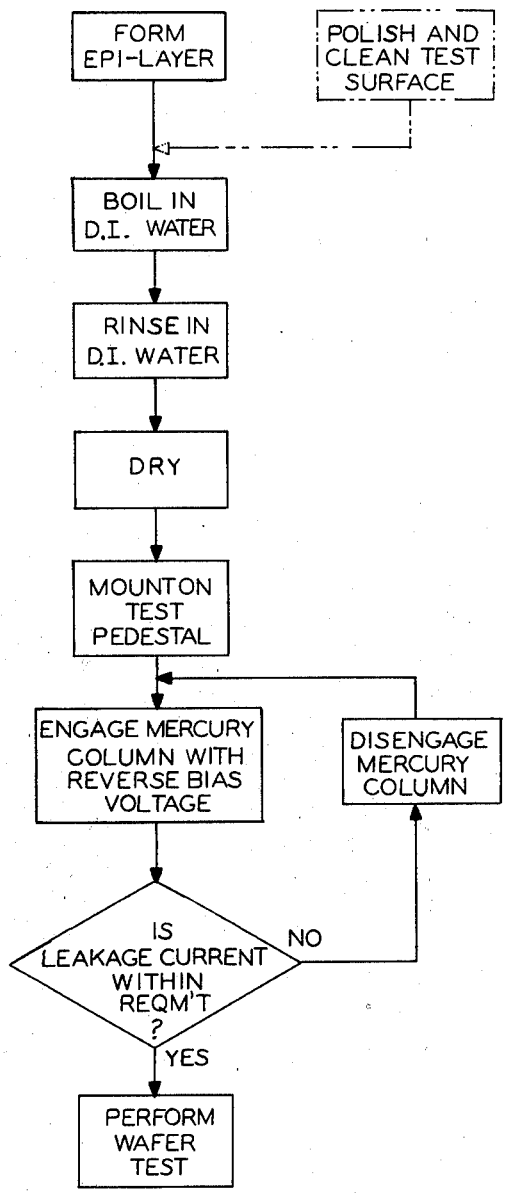
FIG. 3 is a process flow diagram for preparing and testing wafers in accordance with features of this invention.

In the operation of the apparatus 11, the wafer 12 which has been selected for an analysis of its doping profile is placed on a loading chuck or platform 16 while the loading platform 16 is swung into its open or load position as shown by the phantom lines in FIG. 2. In such load position, a swing arm 17 rests against a resiliently yielding backstop 18. A vacuum holder 19 is coupled into the platform 16; however, it may be preferred to shut off the vacuum suction while the wafer is being loaded onto the platform 16, or even for as long as the swing arm 17 rests against the backstop. But as soon as the swing arm 17 is pivoted toward the test position shown in FIG. 1, the vacuum in the loading platform 16 should be turned on to retain the wafer 12 on the platform 16. The pivoting movement of the swing arm 17 positions an exposed, active surface 20 of the wafer 12 against a top surface 21 of a test pedestal 22.

Once the wafer is in position of the pedestal 22, a mechanical clamp 24 may be applied to clamp the platform 16 and the wafer against the top surface 21 of the pedestal 22. As seen from FIG. 1, the clamp 24 is mounted to the apparatus 11 to permit a resilient foot 26 to be vertically adjusted with respect to a lever 27 of the clamp 24. Such an adjustment assures a positive force to maintain a good electrical contact between the backside of the wafer, the side facing the platform 16, and the platform while the wafer is being tested.

During a test which takes place on the active side 20 of wafer 12, after the wafer has been loaded, the vacuum is turned off in the platform 16. Thus, after the clamp 24 is applied, an electrical switch 31 is closed to activate solenoid controlled vacuum valves (not shown) within the apparatus 11. The vacuum valves simply turn off the vacuum to the platform 16 and apply a vacuum at an annular vacuum cavity or ring 32 in the test pedestal 22.

The applied vacuum draws the wafer against the top surface 21 of the pedestal 22. The vacuum becomes thereby distributed throughout the region 33 of the wafer 12 encircled by the vacuum ring 32. The vacuum draws mercury 34 upward in a tube 36 from a reservoir 37 to form the column 13. The tube terminates in the plane of the top surface 21 within the region 33, to form an opening 38 within the pedestal.

Preferably the opening 38 is located centrally within the vacuum region encompassed by the vacuum ring 32. It is desired, of course, to prevent the mercury from being drawn into the vacuum system. Consequently, a mercury separator vessel 41 is coupled into a vacuum line 42. However, under normal operating conditions wherein the vacuum does not exceed 250 mm Hg, surface tension has been found to prevent the mercury from penetrating a narrow separation line between the top surface 21 and the adjacent surface of the wafer 12. Typically, the vacuum is chosen to be within a range between 100 and 250 mm Hg.

Referring again to FIG. 2, an electrical terminal 46 electrically extends through the wall of the tube 36 to electrically couple the rising column 13 of mercury to a first test lead 47 of the test set module 14. A second test lead 48 is, in the desired embodiment, coupled to the loading platform 16. Since the loading platform 16 is in positive contact with the backside of the wafer 12, a test circuit is established wherein the wafer 12 is a serially coupled element.

Of course, contacting the backside of the wafer is only one method to establish electrical contact to the wafer. It is, for example, possible to draw two electrically independent columns of mercury against the active surface 20 of the wafer 12. One of the columns is then coupled to one of the test leads and the other to the second in the manner described. However, such a method of using two mercury columns is presently not preferred. It is further possible to use the periphery of the wafer 12 as a contact area for connecting a second test lead.

The test which is desirably performed on the wafer 12 allows, among other characteristics, the doping density at a desired depth from the surface to be determined. Test methods to obtain data for arriving at the desired characteristics are well known in the art. Also, formulae for calculating specific values of the desired characteristics from the data are well known. For example, ASTM Standard F419 pertains to determining net carrier density in silicon epitaxial layers by capacitance-voltage tests through gated and ungated diodes.

In order to perform such carrier density measurements with any kind of accuracy, it becomes important to form a low leakage current diode at the surface 20 of the wafer 12. During the test, a reverse bias voltage is applied across the terminals to the diode. The reverse bias voltage forms a depletion layer adjacent to the surface within the wafer. An alternating signal is then superimposed on the reverse bias voltage which permits the capacitance within the depletion layer to be determined. For this latter measurement, the interface area between the mercury 34 and the wafer 12 has to be precisely known. The interface area, however, is the size of the opening of the tube 36 in the top surface 21. In the preferred embodiment, the size of the opening 38 is 0.762 mm in diameter.

The capacitance permits a calculation of the net carrier density in the measured region. The depth of the measured region, however, is determined by the voltage to which the junction is reverse biased. Thus by measuring the capacitance at various increasing reverse bias voltages, the doping profile adjacent to the surface of the wafer 12 can be determined down to a maximum depth.

The maximum depth to which the doping profile can be determined is reached when the formed diode breaks down under the reverse bias voltage applied across the formed junction. The breakdown voltage is dependent on the carrier density of the wafer 12. Thus, in a wafer 12 having a comparatively heavy concentration, breakdown of the diode will occur at a relatively low reverse bias voltage. In the preferred embodiment, a typical minimum limiting reverse bias applied to the mercury-to-silicon interface is five volts. Doping profile measurements made on the wafer typically range between an initial, incrementally small reverse bias value and the selected limiting reverse bias value.

Since the normal use of the mercury probe apparatus 11 is for the measurement of p-type doped wafers, the test module 14 preferably should be equipped with a polarity reversing switch (not shown) which controls the polarity of the bias applied to the test leads 47 and 48. Such a switch allows testing of both p-type and n-type doped semiconductor materials. The more negative side of the voltage bias is applied to the mercury 34 for making the described measurements on n-type doped wafers 12. The further description hereunder relates to the technique and procedures of forming a diode at the interface between the mercury 34 and the wafer 12 when the wafer is doped in a region below its surface with n-type impurity atoms, such as, arsenic, antimony or phosphorus.

2. Forming the Diode

Referring now primarily to the process diagram of FIG. 4, various other features and advantages of this invention will be described. The use of reference numerals will be continued even though the referenced item is not called out by numeral in the diagram of FIG. 4. It is believed that this practice facilitates referring back to previously discussed figures if so desired.

The wafers 12 to be prepared for testing are typically those on which an epitaxial layer has been formed by any of a number of known processes in a typical reactor such as, for example, a barrel reactor (not shown). It is desirable to test the epitaxial layers quickly after they have been formed to obtain a fast turnaround reading of the actual doping profile in the epitaxial layers of the wafers. The doping profiles are then compared to desired optimum profile values. Usually a range of concentration profile values is permissible and some deviations from the desired optimum values may be expected. However, when persistent deviations from desired optimum doping concentrations are obtained, the test results are useful as an input to control the operation of the epi reactors during the processing of subsequent wafer lots.

Testing n-type wafers by the following described method is, nevertheless, not limited to testing the concentration profiles in epitaxial layers. N-type dopant concentrations are equally well determined in bulk wafers. To prepare bulk wafers 12 for the test, the surface to be tested is polished and cleaned by known methods.

We have found that an oxide layer can be formed on the surface of the wafer 12 as a precursor for forming a diode by immersing and boiling the wafer in deionized water. A diode can then be formed at an interface between the treated surface of the wafer 12 and mercury by contacting the mercury to the surface. A sufficient and reasonable time period for subjecting the wafer to such boiling water treatment has been found to be four minutes. When the immersion time is less than four minutes, erratic test results may be experienced because of an apparent instability of the reverse leakage current characteristics of the diode. A presently preferred time period for the boiling water treatment is 4.6 minutes. It has been found that during such time period an oxide layer of a thickness in the range between 10 and 20 Angstrom units is grown. The thicknesses are determined by a method known as ellipsometry. Because of the extremely small thickness of the oxide layer, which is estimated to be only in the order of five atomic diameters, a particular stoichiometric structure of the oxide layer cannot be determined and we cannot fully explain why we achieve the advantageous results which are further described hereunder.

It should be mentioned at this point that depending on the surface to be tested, the time period for boiling the wafers may have to be adjusted, possibly even beyond a period of five minutes. The time period of 4.6 minutes was found to be satisfactory for oxidizing polished wafers on which an epitaxial layer had been formed. Polished bulk wafers, on the other hand, may need a slight adjustment of the treatment time to, for example, five minutes. A longer exposure of the wafers 12 has a self-limiting effect on the thickness of the oxide and is, consequently, considered undesirable from a standpoint of achieving a fast turnaround time of test results from the wafers.

It is also believed that a hot water treatment below boiling or a steam treatment can be substituted for the actual immersion of the wafers 12 in liquid boiling water. Immersion in boiling water is preferred because of the temperature control and agitation which boiling water affords. Oxidizing the wafers 12 in a steam atmosphere may cause different rates of oxide growth due to temperature changes and due to the lesser density of water molecules in the steam over that of the liquid.

After the wafers 12 have been treated in the boiling deionized water, they are preferably removed, cooled and rinsed in deionized water at room temperature. After the rinsing, the wafers are spun dry. It is to be noted that the rinsing and drying step is not believed to be essential to the preparation of the wafers for forming the diodes. However, it has been noted that even though the wafers 12 are boiled in commercial grade deionized water, the evaporation of water residue from the surfaces of the heated wafers tend to leave some impurity deposits which are preferably avoided.

When the treated wafers 12 are rinsed and then spin-dried, the spinning action about an axis perpendicular to the wafer surfaces does not remove the water by evaporation but instead radially spins the water from the surfaces of the wafers. The spinning action also removes substantially all loose impurities through a radial flushing action of the water as it is being spun off. The water used for treating as well as for rinsing is preferred to be a commercial grade deionized water. It is desired to avoid exposure of the wafers 12 to impurities which are typically soluble in water and which, when introduced into the wafers 12, would tend to be destructive of desirable electrical characteristics. It should be understood, however, that the advantages herein are obtained by the water rather than by its purity. Therefore, other purity grades of water may be acceptable for purposes of achieving the desired diodes in the manner described herein.

After the wafers 12 are dried in the described manner, they are ready to be loaded onto the apparatus 11 for testing. Then, after one of the wafers 12 is loaded onto the test pedestal as described above, and when the switch 31 is thrown to apply vacuum to the vacuum ring 32, the mercury column rises and contacts the wafer in the precise area defined by the size of the opening 38.

The treatment of the wafer 12 in the boiling water appears to have generated surface states on the silicon which have transformed an otherwise inherently ohmic contact into an inherently rectifying contact, e.g., a diode. However, in most instances, the diode has a reverse leakage current which is too high to permit the desired capacitance-voltage test to be performed with sufficiently accurate results.

We have found, however, that maintaining the contact between the mercury column and the wafer for a prolonged time, results in a gradual reduction in the reverse leakage current characteristics of the diode. Typically, a leaky diode can be improved within two to twenty minutes to have a sufficiently low reverse leakage characteristics to perform the desired test. A reverse leakage current in a range of less than ten micro amps ($10 \times 10^{-6}$ amps) at five volts is considered to be a preferred upper limit for performing the capacitance-voltage test. While the described boiling water treatment of the wafers 12 permits most wafers to be tested within a few minutes after loading them onto the pedestal 22, the time required in permitting the reverse leakage current to subside makes it uneconomical, in a typical manufacturing environment, to test more than one or at most two wafers 12 out of each lot.

However, we have further discovered that the mechanism for reducing the reverse leakage current of the mercury-to-silicon diodes can be aided by repeatedly pulsing the mercury column "on" and "off". By such pulsing, the mercury, while being electrically coupled to the reverse bias potential of the test module 14, makes and breaks contact with the surface of the wafer 12. The pulsing motion of the mercury 34 may be simply achieved by toggling the switch 31 "off" and "on" again at a cycle time of about one second.

Each time the switch 31 is turned "on," and the mercury column 13 contacts the wafer 12, a typical diode test ramp may be impressed, for example, through a typical oscilloscope test circuit (not shown), such that the resultant diode characteristic may be read by an operator. In the alternative, the test module 14 may be used to compute and give a readout of the achieved reverse leakage current characteristics of the diode at the interface between the mercury and the wafer 12. Each time the switch 31 is toggled to the "on" position and the mercury 34 contacts the wafer 12, the reverse leakage current is read at a selected reverse bias voltage which may be, for example, five volts. If, for example, with such a bias the reverse leakage current has fallen below a predetermined threshold value of, for example, five or ten micro amps, the toggling action is discontinued and the capacitance-voltage test is performed in a routine manner.

In experimenting with our discovered technique for rapidly enhancing the low leakage current characteristics of the wafers 12, we tested two groups of wafers, after the wafers 12 had been pretreated in boiling water. Group I consisted of six n-type wafers with surface regions which were doped to concentrations in the range of 4.2 to $8.0 \times 10^{15}$ dopant atoms per cm$^3$. Group II of the wafers 12 consisted of five n-type wafers having surface regions doped to a concentration of 9.6 to $15.0 \times 10^{15}$ atoms per cm$^3$. Charts I and II below show the results for Group I and Group II of the wafers, respectively.

| Pulse | Wafer | | | | | |
|---|---|---|---|---|---|---|
| | 1 | 2 | 3 | 4 | 5 | 6 |
| 1 | 150 | 600 | 350 | 500 | 1000 | 200 |
| 2 | 50 | 50 | 100 | 200 | 350 | 100 |
| 3 | 14 | 40 | 1 | 40 | 2 | 4 |
| 4 | 5 | 12 | | 2 | | 2 |
| 5 | | 2 | | | | |

CHART I: Pulsing effect on reverse leakage current characteristics in micro amps at 5 volts reverse bias in diodes formed on treated n-type wafers having dopant concentrations from 4.2 to $8.0 \times 10^{15}$ atoms/cm$^3$

| Pulse | Wafer | | | | |
|---|---|---|---|---|---|
| | 1 | 2 | 3 | 4 | 5 |
| 1 | 50 | 150 | 100 | 300 | 200 |
| 2 | 10 | 20 | 30 | 150 | 150 |
| 3 | 1 | 10 | 7 | 2 | 0 |
| 4 | | 0 | 2 | | |

CHART II: Pulsing effect on reverse leakage current characteristics in micro amps at 5 volts reverse bias in diodes formed on treated n-type wafers having dopant concentrations from 9.6 to $15.0 \times 10^{15}$ atoms/cm$^3$ We further loaded and pulsed in a similar manner, five n-type doped wafers which had not previously been treated by boiling water. We found that the reverse leakage current characteristics of two of the untreated wafers having the more highly doped surface regions in the range of 9.6 to $15.0 \times 10^{15}$ atoms/cm$^3$ initially ranged from at least $10,000 \times 10^{-6}$ amps and could not be reduced to below $18 \times 10^{-6}$ amps.

The three wafers 12 having surface regions with a lower n-type dopant concentration in the range between 4.2 and $8.0 \times 10^{15}$ atoms/cm$^3$ were affected more advantageously by the pulsing. The reverse leakage current in two of the wafers was reduced from 100,000 and 200,000 micro amps to four and five micro amps, respectively. The reverse leakage current of the third wafer was reduced from 2,000 to 18 micro amps. However, all five of the wafers 12 not previously treated in boiling water showed a rapid deterioration of the reverse leakage current characteristics with time after each pulsing step. Such an instability of the diode junction made the untreated wafers 12 unsuitable for the desired capacitance-voltage test.

In contrast, the above-described technique of pulsing n-type wafers 12, which have been treated in hot water or boiling water as described, has been found to be a practical method in most instances of forming stable diodes with low leakage currents. It appears, however, that a deterioration of the pretreatment occurs between the time of treating the wafers 12 in water and the time that they are tested. Such a deterioration has been noted, particularly under conditions of increased relative humidity of the ambience.

As a result of such deterioration, the reverse bias leakage current of a formed diode tends to remain undesirably high even after pulsing in the described manner. Rubbing the intended contact area with a cotton swab soaked in methyl alcohol just prior to contacting the mercury to the treated surface reactivates the treatment to permit a low leakage diode to be formed in the contacted surface area. It should be noted, however, that merely washing the treated surface in alcohol without the scrubbing action of the cotton swab or a similar non-abrasive instrument does not result in the desired reactivation of the treated surface of the wafer 12.

From reference to the flow diagram of FIG. 4 outlining the desired technique of forming a diode or rectifying interface, it can be realized that the above-mentioned cycle time for disengaging and re-engaging the mercury column 13 with the surface of the wafer 12 is an illustrative value only. From the above description and referring to FIG. 4, it appears desirable to minimize the cycle time in the iterative loop of engaging the column 13, testing the leakage current at the interface of the column with the wafer 12, and then disengaging the column 13.

The response and movement of the mercury column 13 appears to be affected primarily by how fast air can seep into or escape from the tube 36 above the column 13 as a result of the vacuum being switched "off" or "on." Consequently, the cycle time is affected by the value to which the vaccum is regulated. Also, the smoothness of the pedestal 22 and of the surface of the wafer 12 determine the quality of the seal between the vacuum ring 32 and the opening 38 of the tube 36. The quality of such seal, in turn, affects the resistance to air seepage from and into the tube 36.

The cycle time is further related to the speed at which a determination can be made whether the leakage current has reached the threshold requirement for performing the capacitance-voltage test. It stands to reason that an operator would require a longer time to visually interpret a leakage current result, whether shown in analog form on the screen of an oscilloscope or in digital form as a meter readout, than it would take an electrical comparator circuit to compare a result to set threshold signal.

Thus, even though the present invention is described in terms of manually switching the vacuum column by toggling the switch 31, a change may be preferred to employ control signals for automatically cycling through the iterative loop shown in the flow diagram of FIG. 4 and then switching the test module 14 to perform the wafer test. Such a change as well as changes in and modifications to the described features of the invention are possible without departing from the spirit and scope of the invention.

What is claimed is:

1. A method of forming a rectifying contact at a surface of an n-type region in a semiconductor body, said rectifying contact having a reverse bias leakage current smaller than a predetermined, desired value, comprising:

treating the surface of said n-type region with water at an elevated temperature;
engaging said treated surface with a column of mercury having a contact area of a predetermined size with said treated surface to form an interface therewith, and having a negative electrical bias voltage with respect to the semiconductor region;
measuring a leakage current associated with said negative bias voltage;
comparing said leakage current to a predetermined, desired value of said leakage current;
momentarily interrupting the engagement of the mercury column with the treated surface if the leakage current is found to exceed said desired value; and
repeating said steps of measuring, comparing and momentarily interrupting for as long as the measured leakage current is found to exceed said desired value.

2. A method of forming a rectifying contact according to claim 1, wherein treating said surface comprises:
immersing said semiconductor body including said surface into water at an elevated temperature.

3. A method of forming a rectifying contact according to claim 1, wherein treating said surface comprises:
immersing said semiconductor body including said surface into boiling water.

4. A method of forming a rectifying contact according to claim 3, wherein treating said surface further comprises:
retaining said semiconductor body in said boiling water for at least four minutes.

5. A method of forming a rectifying contact according to claim 3, the method further comprising:
rubbing said treated surface with cotton-like means soaked in alcohol prior to placing said mercury in contact with said surface.

6. A method of forming a rectifying contact comprising:
treating a surface of an n-type region in a semiconductor body with an oxidizing agent at a temperature greater than room temperature;
rubbing said treated surface with cotton-like means soaked in alcohol;
placing mercury into contact with said treated surface;
determining whether a leakage current responsive to a negative electrical bias of the mercury with respect to said region exceeds a predetermined value; and
breaking said contact and re-establishing said contact for as long as the leakage current exceeds the predetermined value.

7. A method of forming a rectifying contact comprising:
treating a surface of an n-type region in a silicon semiconductor body with an oxidant at an elevated temperature;
placing mercury which is electrically negatively biased with respect to said region into contact with said treated surface;
measuring a leakage current responsive to the negative bias of the mercury with respect to said region to determine whether the leakage current exceeds a predetermined desirable value; and
breaking said contact and re-establishing said contact to lower said leakage current toward said predetermined desirable value.

8. A method of forming a rectifying contact according to claim 7, wherein the contact is formed for determining characteristics associated with said region, comprising:

testing the region electrically through said mercury as an electrical terminal to such semiconductor body upon said leakage current having fallen to a value equal to or less than the desirable value; and removing the mercury from contact with said surface upon completion of such test.

9. A method of forming a contact according to claim 8, wherein treating a surface comprises:

placing said surface into boiling water for a period in excess of four minutes.

10. A method of forming a contact according to claim 9, further comprising:

rubbing said surface with cotton-like means soaked in methyl alcohol prior to placing mercury into contact therewith.

11. A method of nondestructively testing characteristics of an n-type region adjacent to a surface of a semiconductor body comprising:

treating said surface in an oxidant to form an oxide of a thickness in a range between 10 and 20 Angstrom units;

contacting said treated surface with mercury having a negative bias voltage with respect to such region;

comparing a reverse leakage current flowing across said contacted, treated surface to a desired value; and breaking said contact between said mercury and said contacted, treated surface and repeating the steps of contacting and comparing for as long as said leakage current exceeds said desired value, and testing said characteristics upon said reverse leakage current being equal to or less than said desired value.

12. A method according to claim 11, wherein treating said surface comprises:

immersing said semiconductor in boiling water.

* * * * *